(12) United States Patent
Jang

(10) Patent No.: US 9,768,336 B2
(45) Date of Patent: Sep. 19, 2017

(54) SOLAR CELL MODULE

(75) Inventor: Daehee Jang, Seoul (KR)

(73) Assignee: LG Electronics Inc., Seoul (KR)

( * ) Notice: Subject to any disclaimer, the term of this patent is extended or adjusted under 35 U.S.C. 154(b) by 1102 days.

(21) Appl. No.: 13/444,285

(22) Filed: Apr. 11, 2012

(65) Prior Publication Data

US 2012/0291838 A1    Nov. 22, 2012

(30) Foreign Application Priority Data

May 18, 2011   (KR) .................... 10-2011-0046875

(51) Int. Cl.
| | | |
|---|---|---|
| *H01L 31/05* | (2014.01) | |
| *H01L 31/048* | (2014.01) | |
| *H01L 31/0224* | (2006.01) | |
| *H01L 31/068* | (2012.01) | |

(52) U.S. Cl.
CPC .... *H01L 31/0516* (2013.01); *H01L 31/02245* (2013.01); *H01L 31/022441* (2013.01); *H01L 31/048* (2013.01); *H01L 31/0682* (2013.01); *Y02E 10/547* (2013.01)

(58) Field of Classification Search
CPC ....... H01L 31/02245; H01L 31/022458; H01L 31/0516
See application file for complete search history.

(56) References Cited

U.S. PATENT DOCUMENTS

| | | | | |
|---|---|---|---|---|
| 2009/0183759 A1* | 7/2009 | Hishida | ............ | H01L 31/02245 136/244 |
| 2009/0272419 A1* | 11/2009 | Sakamoto et al. | ............ | 136/244 |
| 2010/0200058 A1* | 8/2010 | Funakoshi | .................... | 136/256 |
| 2011/0017281 A1* | 1/2011 | Funakoshi et al. | ........... | 136/251 |
| 2011/0083715 A1 | 4/2011 | Kang et al. | | |
| 2011/0094562 A1* | 4/2011 | Funakoshi | ........ | B32B 17/10018 136/244 |
| 2011/0120530 A1 | 5/2011 | Isaka | | |
| 2011/0146747 A1* | 6/2011 | Hieslmair | .................... | 136/244 |

(Continued)

FOREIGN PATENT DOCUMENTS

| | | | |
|---|---|---|---|
| DE | 10-2007-035883 | A1 | 2/2009 |
| DE | 102008043833 | A1 * | 5/2010 |

(Continued)

OTHER PUBLICATIONS

Machine translation of DE102008043833A1.*

*Primary Examiner* — Eric R Smith
(74) *Attorney, Agent, or Firm* — Birch, Stewart, Kolasch & Birch, LLP

(57) ABSTRACT

A solar cell module includes a plurality of solar cells and includes first and second solar cells positioned adjacent to each other in a first direction, the solar cell module further comprises a connector for connecting hole terminals of the first solar cell to electron terminals of the second solar cell, the hole terminals being positioned on the first solar cell and being separated from each other and the electron terminals being positioned on the second solar cell and being separated from each other. The hole terminals and the electron terminals of each solar cell are positioned parallel to a first side of each solar cell, the connector is positioned parallel to a second side crossing the first side of each solar cell, and the connector is positioned on the same side of the first and second solar cells.

10 Claims, 15 Drawing Sheets

(56) References Cited

U.S. PATENT DOCUMENTS

2011/0277817 A1* 11/2011 Ide .................... H01L 31/02244
                                                                136/246
2012/0048335 A1   3/2012 Nakamura

FOREIGN PATENT DOCUMENTS

| EP | 2 317 566 A2 | 5/2011 |
| EP | 2 320 477 A1 | 5/2011 |
| JP | 2006-120945 A | 5/2006 |
| JP | 2010-16074 A | 1/2010 |
| JP | WO2010001927 A1 * | 1/2010 |
| JP | WO2010021204 A1 * | 2/2010 |
| KR | 10-2010-0123163 A | 11/2010 |
| KR | 10-2011-0038242 A | 4/2011 |
| WO | WO 2008/078741 A1 | 7/2008 |
| WO | WO 2009/025147 A1 | 2/2009 |
| WO | WO 2009/147890 A1 | 12/2009 |
| WO | WO 2010/122935 A1 | 10/2010 |

* cited by examiner

SOLAR CELL MODULE

This application claims priority to and the benefit of Korean Patent Application No. 10-2011-0046875, filed in the Korean Intellectual Property Office on May 18, 2011, the entire contents of which are incorporated herein by reference.

BACKGROUND OF THE INVENTION

Field of the Invention

Embodiments of the invention relate to a solar cell module.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, electrons and holes are produced in the semiconductor parts. The electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

A plurality of solar cells having the above-described configuration are connected in series or parallel to one another to manufacture a panel type solar cell module capable of obtaining a desired output.

SUMMARY OF THE INVENTION

In one aspect, there is a solar cell module including a plurality of solar cells each including a substrate of a first conductive type, a plurality of hole terminals and a plurality of electron terminals, the plurality of hole terminals and the plurality of electron terminals being positioned opposite an incident surface of the substrate on which light is incident, a first protective layer positioned on the incident surfaces of the plurality of solar cells, a transparent member positioned on the first protective layer, and a second protective layer positioned on surfaces opposite the incident surfaces of the plurality of solar cells, wherein the plurality of solar cells include a first cell and a second solar cell positioned adjacent to each other in a first direction, wherein the solar cell module further includes a connector for connecting hole terminals of the first solar cell to electron terminals of the second solar cell, the hole terminals being positioned on the first solar cell and being separated from each other and the electron terminals being positioned on the second solar cell and being separated from each other, wherein the plurality of hole terminals and the plurality of electron terminals of each solar cell are positioned parallel to a first side of each solar cell, wherein the connector is positioned parallel to a second side crossing the first side of each solar cell, and wherein the connector is positioned on the same side of the first and second solar cells.

The first side may be parallel to a surface of a short axis of the solar cell module and the second surface may be parallel to a surface of a long axis of the solar cell module.

The third connector may directly connect the hole terminals of the first solar cell and the electron terminals of the second solar cell.

The solar cell module may further include a plurality of first connectors directly connected to the plurality of hole terminals of the plurality of solar cells and a plurality of second connectors directly connected to the plurality of electron terminals of the plurality of solar cells. First connectors of the first solar cell and second connectors of the second solar cell may be connected to one another using the connector being a third connector.

The third connector extends in a direction crossing the plurality of first and second connectors.

The third connector may be entirely positioned outside the first and second solar cells.

Portions of the first connectors of the first solar cell and portions of the second connectors of the second solar cell protrude to the outside of the first and second solar cells and are connected to the third connector.

The plurality of solar cells may further include third and fourth solar cells positioned adjacent to each other in a first direction parallel to the first side. The solar cell module may further include a fourth connector, which is connected to the first connectors of the third solar cell and to the second connectors of the fourth solar cell.

The fourth connector may be entirely positioned outside the third and fourth solar cells.

The fourth connector may be positioned on different sides of the third and fourth solar cells.

The solar cell module may further include a back sheet positioned under the second protective layer. The connector may be formed on the back sheet in a pattern shape.

The second protective layer may include openings exposing the plurality of hole terminals and the plurality of electron terminals.

A distance between the hole terminals of each of the first and second solar cells and the second side of each of the first and second solar cells adjacent to the hole terminals may be different from a distance between the electron terminals of each of the first and second solar cells and the second side of each of the first and second solar cells adjacent to the electron terminals.

The connector may directly connect the hole terminals of the first solar cell or the second solar cell to the electron terminals of the second solar cell or the first solar cell. A distance between the hole terminals and the electron terminals connected to the connector and the second sides of the first and second solar cells may be less than a distance between the electron terminals and the hole terminals not connected to another connector and the second sides of the first and second solar cells.

The plurality of solar cells may further include third and fourth solar cells positioned adjacent to each other in a first direction parallel to the first side. A terminal disposed adjacent to the second side of the third solar cell may be the same kind of terminal disposed adjacent to the second side of the fourth solar cell.

The third connector may be positioned to overlap the first and second solar cells.

The plurality of solar cells may further include third and fourth solar cells positioned adjacent to each other in a first direction parallel to the first side. The solar cell module may further include a another connector connected to hole terminals of the third solar cell and to electron terminals of the fourth solar cell.

A distance between the hole terminals and the electron terminals connected to the another connector and the second sides of the third and fourth solar cells may be less than a distance between the electron terminals and the hole terminals not connected to the another connector and the second sides of the third and fourth solar cells.

The another connector may be positioned to overlap the third and fourth solar cells.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
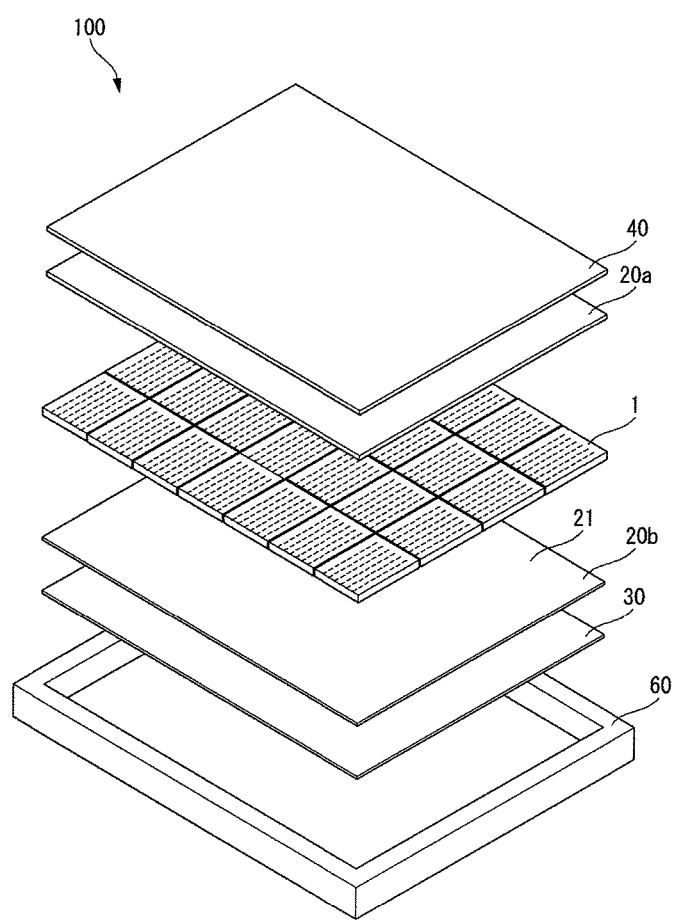
FIG. 1 is a schematic perspective view of a solar cell module according to an example embodiment of the invention.

Embodiments of the invention will be described more fully hereinafter with reference to the accompanying drawings, in which example embodiments of the invention are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A solar cell module according to an example embodiment of the invention is described in detail with reference to the accompanying drawings.

As shown in FIG. 1, a solar cell module 100 according to an example embodiment of the invention includes a plurality of solar cells 1, protective layers 20a and 20b for protecting the solar cells 1, a transparent member 40 on the protective layer 20a (hereinafter, referred to as an "upper protective layer") positioned on light receiving surfaces of the solar cells 1, a back sheet 30 positioned under the protective layer 20b (hereinafter, referred to as "lower protective layer") positioned on surfaces, opposite the light receiving surfaces, on which light is not incident, a pattern forming part 50 positioned under the back sheet 30, and a frame 60 for receiving the above components 1, 20a, 20b, 30, 40, and 50.

The transparent member 40 on the light receiving surface of the solar cell module 100 is formed of a tempered glass having a high transmittance of light to prevent a damage of the solar cell module 100. The tempered glass may be a low iron tempered glass containing a small amount of iron. The transparent member 40 may have an embossed inner surface so as to increase a scattering effect of light.

The upper and lower protective layers 20a and 20b prevent corrosion of metal resulting from moisture penetration and protect the solar cell module 100 from an impact. The upper and lower protective layers 20a and 20b and the plurality of solar cells 1 form an integral body when a lamination process is performed in a state where the upper and lower protective layers 20a and 20b are respectively positioned on and under the solar cells 1. The upper and lower protective layers 20a and 20b may be formed of ethylene vinyl acetate (EVA), etc. Other materials may be used.

The back sheet 30 is formed using a thin sheet formed of an insulating material such as fluoropolymer/polyester/fluoropolymer (FP/PE/FP). Other insulating materials may be used.

The back sheet 30 prevents moisture and oxygen from penetrating into a back surface of the solar cell module 100, thereby protecting the solar cells 1 from the external environment. The back sheet 30 may have a multi-layered structure including a moisture/oxygen penetrating prevention layer, a chemical corrosion prevention layer, an insulation layer, etc.

As shown in FIG. 1, the plurality of solar cells 1 of the solar cell module 100 are arranged in a matrix structure.

The plurality of solar cells 1 of the solar cell module 100 may be generally arranged in the structure of a 6×10 matrix or a 4×9 matrix.

Although FIG. 1 shows the solar cells 1 having the structure of 4×7 matrix in the embodiment of the invention, the number of solar cells 1 in column and/or row directions may vary, if necessary or desired.

All of the solar cells 1 have the same structure. In the embodiment of the invention, each solar cell 1 is a back contact solar cell, in which an electron current collector or an electron electrode serving as a terminal for outputting electrons to the outside, and a hole current collector or a hole electrode serving as a terminal for outputting holes to the outside are formed on a back surface of a substrate of the solar cell 1. The back surface of the substrate of the solar cell 1 is positioned opposite a front surface (i.e., a light incident surface) of the substrate of the solar cell 1. Thus, light is not incident on the back surface of the substrate, or only a small amount of light is incident on the back surface of the substrate.

Examples of the back contact solar cell include a metal wrap through (MWT) solar cell, in which both the electron current collector and the hole current collector are positioned on the back surface of the substrate, and an interdigitated back contact (IBC) solar cell, in which both the electron electrode and the hole electrode are positioned on the back surface of the substrate.

Figure 2:
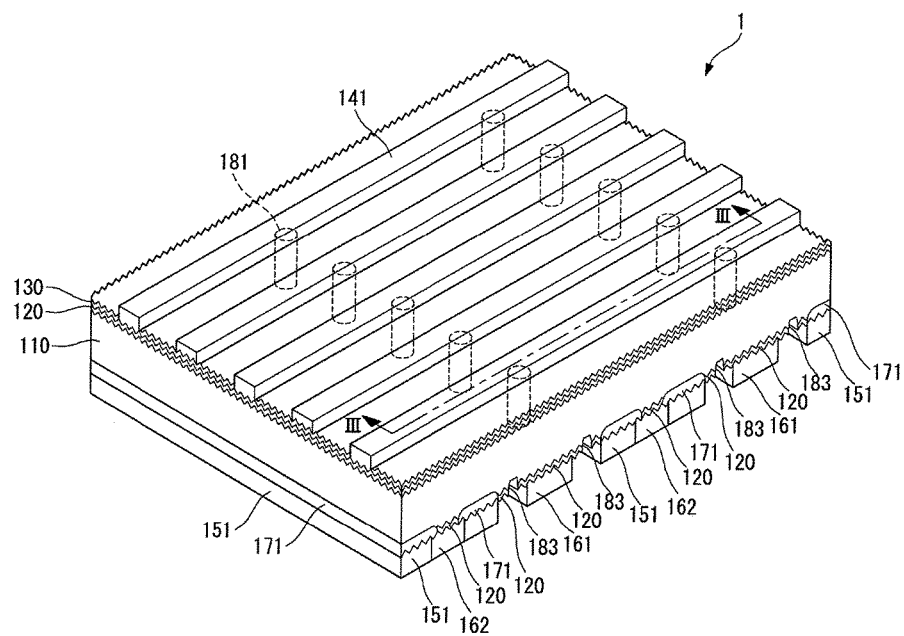
FIG. 2 is a partial perspective view schematically showing a metal wrap through (MWT) solar cell as an example of a back contact solar cell.
Figure 3:
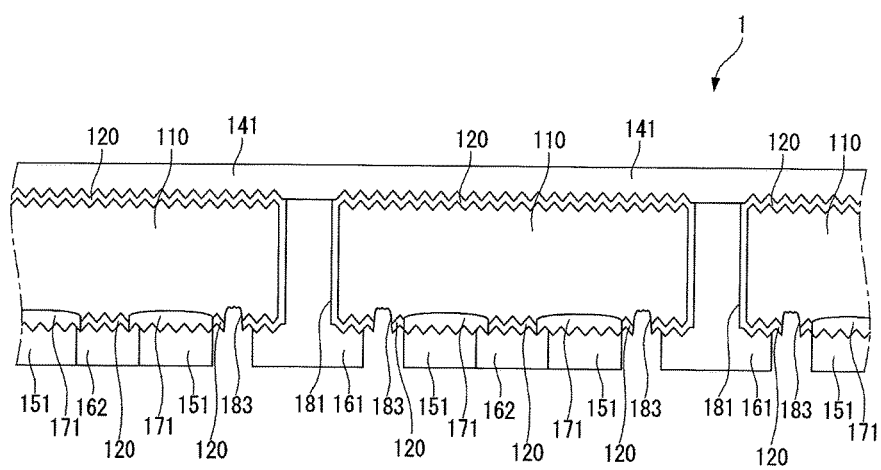
FIG. 3 is a cross-sectional view taken along line III-III of FIG. 2.

FIGS. 2 and 3 show the MWT solar cell as an example of the back contact solar cell.

As shown in FIGS. 2 and 3, the MWT solar cell 1 according to the embodiment of the invention includes a substrate 110 having a plurality of via holes 181, an emitter region 120 positioned at the substrate 110, an anti-reflection layer 130 positioned on the emitter region 120 of an incident surface (hereinafter, referred to as "a front surface") of the substrate 110 on which light is incident, a plurality of front electrodes 141 positioned on the emitter region 120 of the front surface of the substrate 110 on which the anti-reflection layer 130 is not positioned, a plurality of back electrodes 151 positioned on a surface (hereinafter, referred to as "a back surface") opposite the front surface of the substrate 110, a plurality of front electrode current collectors 161, a plurality of back electrode current collectors 162, and a back surface field (BSF) region 171 positioned at the back surface of the substrate 110. The plurality of front electrode current collectors 161 are positioned in the via holes 181 and on the emitter region 120 of the back surface of the substrate 110 around the via holes 181 and are electrically connected to the plurality of front electrodes 141. The back electrode current collectors 162 are positioned on the back surface of the substrate 110 and are electrically connected to the back electrodes 151.

The substrate 110 is a semiconductor substrate, which may be formed of first conductive type silicon, for example, p-type silicon, though not required. In the embodiment of the invention, silicon may be single crystal silicon or polycrystalline silicon. When the substrate 110 is of a p-type, the substrate 110 is doped with impurities of a group III element such as boron (B), gallium (Ga), and indium (In). Alternatively, the substrate 110 may be of an n-type, and/or be formed of semiconductor materials other than silicon. If the substrate 110 is of the n-type, the substrate 110 may be doped with impurities of a group V element such as phosphor (P), arsenic (As), and antimony (Sb).

The surface of the substrate 110 is textured to form a textured surface corresponding to an uneven surface or having uneven characteristics. FIG. 2 shows only an edge of the substrate 110 and only an edge of the anti-reflection layer 130 on the substrate 110 as having a plurality of uneven portions for the sake of brevity. However, the entire front surface of the substrate 110 is the textured surface having the plurality of uneven portions, and thus the anti-reflection layer 130 on the front surface of the substrate 110 has the textured surface having the plurality of uneven portions.

An amount of light reflected from the front surface of the substrate 110 decreases because of the textured surface of the substrate 110 having the plurality of uneven portions, and thus an amount of light incident to the inside of the substrate 110 increases. Further, the size of the front surface of the substrate 110 and the surface area of the anti-reflection layer 130 increase because of the textured surface of the substrate 110. As a result, an amount of light incident on the substrate 110 increases.

The emitter region 120 is a region obtained by doping the substrate 110 with impurities of a second conductive type (for example, an n-type) opposite the first conductive type of the substrate 110, so as to be an n-type semiconductor, for example. Thus, the emitter region 120 of the second conductive type forms a p-n junction along with the substrate 110 of the first conductive type.

Among carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 120. Thus, when the substrate 110 is of the p-type and the emitter region 120 is of the n-type, the holes and the electrons move to the substrate 110 and the emitter region 120, respectively.

Because the emitter region 120 forms the p-n junction along with the substrate 110 (i.e., a first conductive region of the substrate 110), the emitter region 120 may be of the p-type when the substrate 110 is of the n-type unlike the embodiment described above. In this instance, the electrons and the holes move to the substrate 110 and the emitter region 120, respectively.

Returning to the embodiment of the invention, when the emitter region 120 is of the n-type, the emitter region 120 may be formed by doping the substrate 110 with impurities of a group V element such as P, As, and Sb. On the contrary, when the emitter region 120 is of the p-type, the emitter region 120 may be formed by doping the substrate 110 with impurities of a group III element such as B, Ga, and In.

The anti-reflection layer 130 positioned on the emitter region 120 of the front surface of the substrate 110 is formed of hydrogenated silicon nitride ($SiN_x$:H), hydrogenated silicon oxide ($SiO_x$:H), or hydrogenated silicon nitride-oxide ($SiN_xO_y$:H), etc. The anti-reflection layer 130 reduces a reflectance of light incident on the MWT solar cell 1 and increases selectivity of a predetermined wavelength band, thereby increasing the efficiency of the MWT solar cell 1.

The anti-reflection layer 130 performs a passivation function that converts a defect, for example, dangling bonds existing at and around the surface of the substrate 110 into stable bonds to thereby prevent or reduce a recombination and/or a disappearance of carriers moving to the surface of the substrate 110. Hence, the anti-reflection layer 130 reduces an amount of carriers lost by the defect at the surface of the substrate 110.

The anti-reflection layer 130 shown in FIG. 2 has a single-layered structure. The anti-reflection layer 130 shown in FIG. 2 may have a multi-layered structure such as a double-layered structure and a triple-layered structure. The anti-reflection layer 130 may be omitted, if desired.

The plurality of front electrodes 141 are positioned on the emitter region 120 formed at the front surface of the substrate 110 and are electrically and physically connected to the emitter region 120.

The front electrodes 141 extend substantially parallel to one another in a fixed direction.

The front electrodes 141 collect carriers (for example, electrons) moving to the emitter region 120 and transfer the carriers to the front electrode current collectors 161, which are one of the electron current collector and the hole current collector, for example, the electron current collector electrically connected to the front electrodes 141 through the via holes 181. The front electrodes 141 contain at least one conductive material, for example, silver (Ag).

Each of the plurality of front electrode current collectors 161 positioned on the back surface of the substrate 110 is referred to as a bus bar and is formed of at least one conductive material. The front electrode current collectors 161 extend substantially parallel to one another in a direction crossing an extending direction of the front electrodes 141 positioned on the front surface of the substrate 110 and thus have a stripe shape.

As shown in FIGS. 2 and 3, the plurality of via holes 181 are formed in the substrate 110 at crossings of the front electrodes 141 and the front electrode current collectors 161. Because at least one of the front electrode 141 and the front electrode current collector 161 extends to at least one of the front surface and the back surface of the substrate 110 through the via hole 181, the front electrode 141 and the front electrode current collector 161 respectively positioned on the opposite surfaces of the substrate 110 are connected to each other. Hence, the front electrodes 141 are electrically and physically connected to the front electrode current collectors 161 through the via holes 181.

The front electrode current collectors 161 output the carriers transferred from the front electrodes 141 electrically connected to the front electrode current collectors 161 to an external device.

In the embodiment of the invention, the front electrode current collectors 161 may contain the same material as the front electrodes 141, for example, silver (Ag).

The back electrodes 151 on the back surface of the substrate 110 are positioned to be spaced apart from the front electrode current collectors 161 adjacent to the back electrodes 151.

The back electrodes 151 are positioned on almost the entire back surface of the substrate 110 excluding formation portions of the front electrode current collectors 161 and the back electrode current collectors 162 on the back surface of the substrate 110. Additionally, the back electrodes 151 may not be positioned at an edge of the back surface of the substrate 110.

The back electrodes 151 collect carriers (for example, holes) moving to the substrate 110.

The emitter region 120 positioned at the back surface of the substrate 110 has a plurality of exposing portions 183 that expose a portion of the back surface of the substrate 110 and surround the front electrode current collectors 161.

The expositing portions 183 block an electrical connection between the front electrode current collectors 161 collecting electrons or holes, and the back electrodes 151 collecting holes or electrons, thereby causing the electrons and the holes to move smoothly.

The back electrodes 151 contain at least one conductive material different from the material of the front electrode current collectors 161. For example, the back electrodes 151 may contain at least one conductive material such as aluminum (Al).

The back electrode current collectors 162 serving as the hole current collector are positioned on the back surface of the substrate 110 and are electrically and physically connected to the back electrodes 151. Further, the back electrode current collectors 162 extend substantially parallel to the front electrode current collectors 161.

Thus, the back electrode current collectors 162 collect carriers (for example, holes) transferred from the back electrodes 151 and output the carriers to the external device.

The back electrode current collectors 162 are formed of the same material as the front electrode current collectors 161. Thus, the back electrode current collectors 162 contain at least one conductive material, for example, silver (Ag).

In the embodiment of the invention, the back electrode current collectors 162 have a stripe shape elongated (or extending) in a fixed direction in the same manner as the front electrode current collectors 161.

Figure 4:
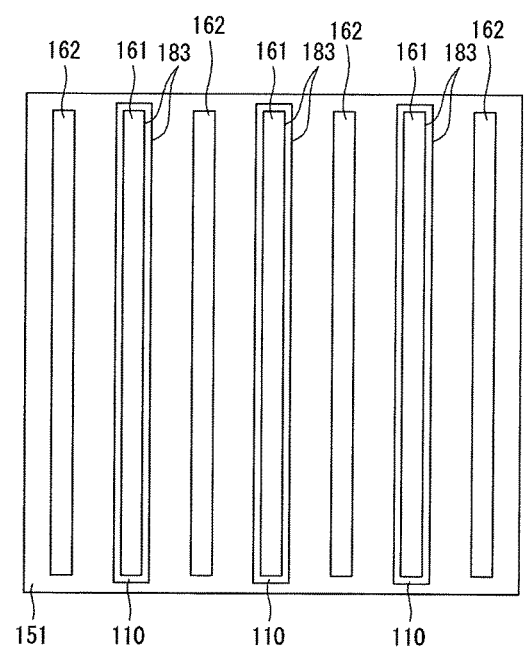
FIG. 4 schematically illustrates a back structure of the MWT solar cell shown in FIG. 2.

FIG. 4 illustrates an example shape or layout of the back surface of the substrate 110 on which the front electrode current collectors 161 and the back electrode current collectors 162 are positioned.

For example, FIG. 4 shows the three front electrode current collectors 161 and the four back electrode current collectors 162. However, the number of front electrode current collectors 161 and the number of back electrode current collectors 162 may vary, if desired.

As shown in FIG. 4, the front electrode current collectors 161 and the back electrode current collectors 162 are alternately positioned on the back surface of the substrate 110 at a constant distance therebetween. The back electrodes 151 are positioned in positions between the front electrode current collectors 161 and the back electrode current collectors 162. In this instance, the exposing portions 183 are formed along the front electrode current collectors 161, so as to provide an electrical insulation between the back electrodes 151 and the front electrode current collectors 161. Hence, a portion of the substrate 110 is exposed through the exposing portions 183.

Unlike the configuration illustrated in FIG. 4, each back electrode 151 and each back electrode current collector 162 may partially overlap each other in other embodiments of the invention. For example, a portion of an edge of the back electrode current collector 162 may be positioned on the back electrode 151, or a portion of the back electrode 151 may be positioned on the back electrode current collector 162. In this instance, a contact area between the back electrode 151 and the back electrode current collector 162 increases, and a contact resistance between the back electrode 151 and the back electrode current collector 162 decreases. As a result, a transfer of carriers from the back electrode 151 to the back electrode current collector 162 may be stably performed because of the stable contact therebetween.

Alternatively, each back electrode current collector 162 may have an island shape in which a plurality of conductors are positioned in a fixed direction at a constant distance therebetween. Each of the plurality of conductors may have various cross-sectional shapes such as a rectangle, a triangle, a circle, and an oval. Even in this instance, each conductor may partially overlap the back electrode 151.

The back surface field region 171 is a region (for example, a $p^+$-type region) obtained by more heavily doping a portion of the back surface of the substrate 110 with impurities of the same conductive type as the substrate 110 than the substrate 110. Because the back surface field region 171 is positioned at the back surface of the substrate 110 adjoining the back electrodes 151, the back electrodes 151 are electrically connected to the substrate 110 through the back surface field region 171.

The movement of electrons to the back surface field region 171 is prevented or reduced and also the movement of holes to the back surface field region 171 is facilitated because of a potential barrier formed by a difference between impurity concentrations of the substrate 110 and the back surface field region 171. Thus, a recombination and/or a disappearance of electrons and holes in and around the back surface of the substrate 110 are prevented or reduced, and the movement of desired carriers (for example, holes) is accelerated. As a result, a transfer amount of carriers to the back electrodes 151 and the back electrode current collectors 162 increases.

As shown in FIG. 4, all of the plurality of the front electrode current collectors 161 and the plurality of back electrode current collectors 162 are positioned on a surface (for example, the back surface) of the substrate 110. In this instance, the plurality of front electrode current collectors 161 are separated from each other and extend in the same direction and the plurality of back electrode current collectors 162 are separated from each other and extend in the same direction. Further, the front electrode current collector 161 and the back electrode current collector 162 are alternately positioned on the back surface of the substrate 110. As shown in FIG. 4, the solar cell 1 does not include an element for connecting all of the plurality of front electrode current collectors 161 and an element for connecting all of the plurality of back electrode current collectors 162, and thereby, all the front electrode current collectors 161 are electrically and physically separated from each other and all the back electrode current collectors 162 are also electrically and physically separated from each other.

The IBC solar cell is described below as an example of the back contact solar cell with reference to FIGS. 5 to 7.

Figure 5:
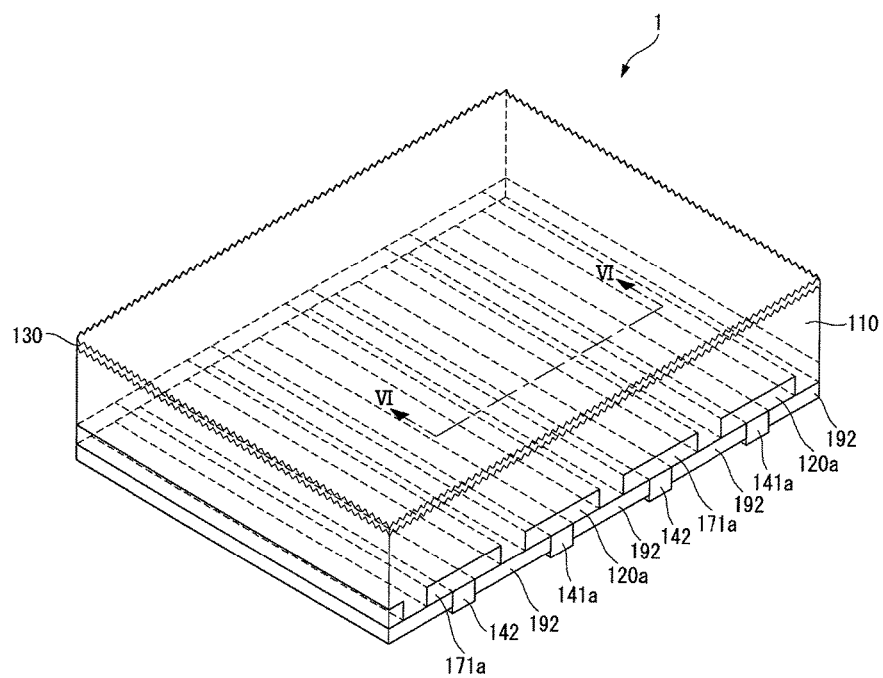
FIG. 5 is a partial perspective view schematically showing an interdigitated back contact (IBC) solar cell as another example of a back contact solar cell.
Figure 6:
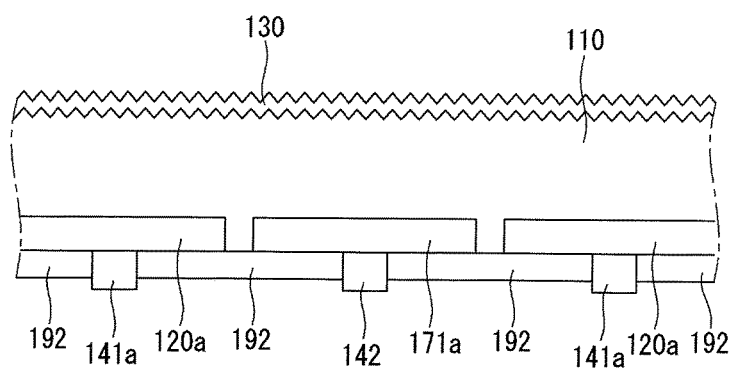
FIG. 6 is a cross-sectional view taken along line VI-VI of FIG. 5.
Figure 7:
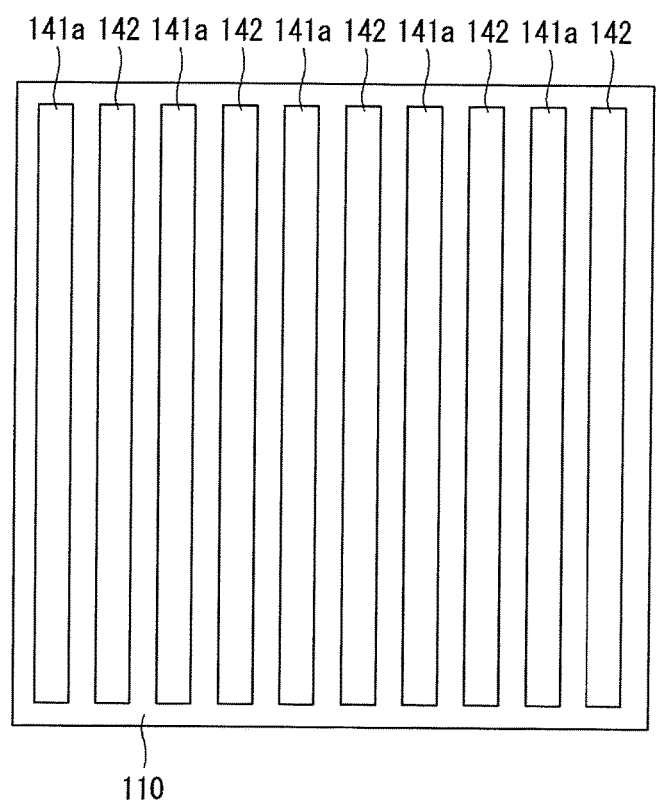
FIG. 7 schematically illustrates a back structure of the IBC solar cell shown in FIG. 5.

Structures and components identical or equivalent to those illustrated in FIGS. 2 to 4 are designated with the same reference numerals in the solar cell shown in FIGS. 5 to 7, and a further description may be briefly made or may be entirely omitted.

As shown in FIGS. 5 and 6, the IBC solar cell 1 according to the embodiment of the invention includes a plurality of emitter regions 120a of a second conductive type positioned at a back surface of a substrate 110 of a first conductive type, a plurality of back surface field regions 171a of the first conductive type which are positioned at the back surface of the substrate 110 to be spaced apart from the plurality of emitter regions 120a, a plurality of first electrodes 141a which are positioned on the substrate 110 and are respectively connected to the plurality of emitter regions 120a, a plurality of second electrodes 142 which are positioned on the substrate 110 and are respectively connected to the plurality of back surface field regions 171a, a back passivation layer 192 positioned between the adjacent first and second electrodes 141a and 142, and an anti-reflection layer 130 positioned on a front surface of the substrate 110.

In the embodiment of the invention, the substrate 110 may be formed of crystalline silicon such as single crystal silicon and polycrystalline silicon. The emitter regions 120a and the back surface field regions 171a may be formed by injecting impurities of a corresponding conductive type into the substrate 110 using an impurity diffusion method or an ion implantation method, etc. Thus, the emitter regions 120a and the back surface field regions 171a may be formed of crystalline silicon in the same manner as the substrate 110.

Similar to the front electrodes 141 and the back electrodes 151 shown in FIGS. 2 and 3, the first electrodes 141a and the second electrodes 142 collect carriers moving through the emitter regions 120a and contain a conductive material such as silver (Ag) and aluminum (Al).

The back passivation layer 192 may be formed of amorphous silicon. The back passivation layer 192 performs a passivation function at the back surface of the substrate 110 and prevents an electrical interference between the first and second electrodes 141a and 142.

In other embodiments of the invention, the back contact solar cell may be a back contact heterojunction solar cell.

Since configuration of the back contact heterojunction solar cell is substantially the same as the IBC solar cell shown in FIGS. 5 and 6, except that a plurality of emitter regions of the second conductive type formed of amorphous silicon and a plurality of back surface field regions of the first conductive type formed of amorphous silicon are positioned on a substrate of the first conductive type formed of crystalline silicon, a further description may be briefly made or may be entirely omitted.

Accordingly, the back surface of the substrate of the IBC solar cell or the back contact heterojunction solar cell is configured so that the first electrodes 141a and the second electrodes 142 are alternately positioned thereon as shown in FIG. 7. The number of first electrodes 141a and the number of second electrodes 142 shown in FIG. 7 are simply one example. Other numbers may be used.

As shown in FIG. 7, all of the plurality of the first electrodes 141a and the plurality of second electrodes 142 are positioned on the surface (for example, the back surface) of the substrate 110. The plurality of front electrodes 141a are separated from each other and extend in the same direction and the plurality of back electrodes 142 are separated from each other and extend in the same direction. Further, the front electrodes 141a and the back electrodes 142 are alternately positioned on the back surface of the substrate 110. Similar to FIG. 4, the solar cell 1 does not include an element for connecting all of the plurality of first electrodes 141a, and an element for connecting all of the plurality of second electrodes. 142, and thereby, all the first electrodes 141a are electrically and physically separated from each other and all the second electrodes 142 are also electrically and physically separated from each other.

An operation of the solar cell 1, for example, the back contact solar cell having the above-described structure (i.e., the IBC structure) is described below.

When light irradiated to the solar cell 1 is incident on the substrate 110 through the emitter region 120 (or 120a), electrons and holes are generated in the substrate 110 by light energy produced based on the incident light. Because the surface of the substrate 110 is the textured surface, a light reflectance in the surface of the substrate 110 decreases and an amount of light incident on the substrate 110 increases. In addition, because a reflection loss of the light incident on the substrate 110 is reduced by the anti-reflection layer 130, an amount of light incident on the substrate 110 further increases.

The electrons move to the n-type emitter region 120 (or 120a) and the holes move to the p-type substrate 110 by the p-n junction between the substrate 110 and the emitter region 120 (or 120a). The electrons moving to the n-type emitter region 120 (or 120a) are collected by the front electrodes 141 and then move to the front electrode current collectors 161 electrically connected to the front electrodes 141 through the via holes 181. The holes moving to the p-type substrate 110 are collected by the back electrodes 151 through the back surface field region 171 and then move to the back electrode current collectors 162 or move to the first electrodes 141a or the second electrodes 142.

As described above, the plurality of solar cells 1 of the solar cell module 100 are arranged in the matrix structure and are connected in series or parallel to one another A serial connection structure of the plurality of solar cells 1 having the matrix structure according to the embodiment of the invention is described below with reference to FIG. 8.

Figure 8:
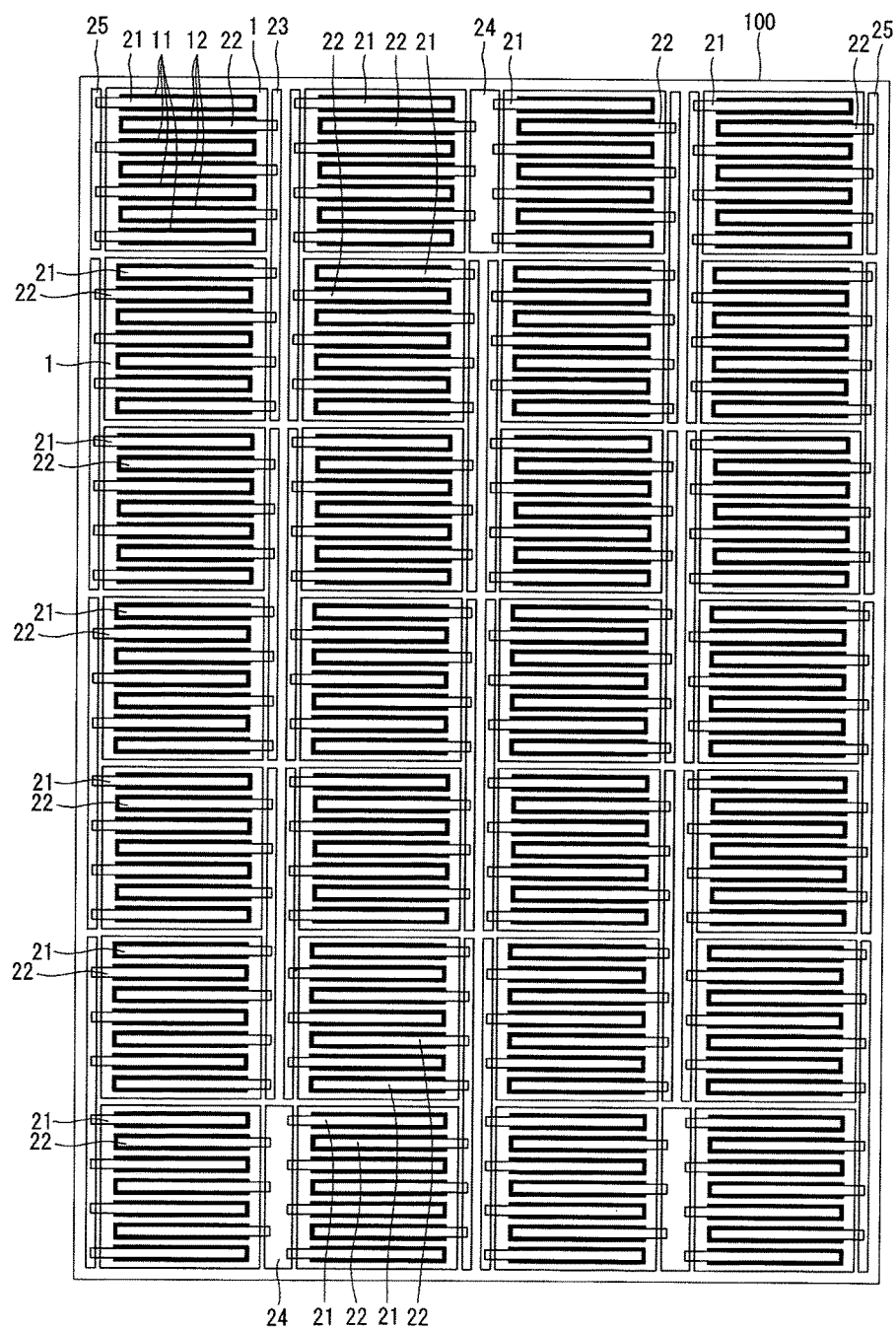
FIGS. 8 and 9 illustrate various examples of a connection structure of a back contact solar cell according to an example embodiment of the invention.

FIG. 8 shows the plurality of solar cells arranged in the structure of 4×7 matrix. Other matrix structures may be used for the solar cells.

When the solar cell 1 shown in FIG. 8 is the MWT solar cell, a hole terminal 11 may be one of the front electrode current collector 161 and the back electrode current collector 162, and an electron terminal 12 may be the other current collector. Alternatively, when the solar cell 1 shown in FIG. 8 is the IBC solar cell or the back contact heterojunction solar cell, the hole terminal 11 may be one of the first electrode 141a and the second electrode 142, and the electron terminal 12 may be the other electrode.

As shown in FIG. 8, the plurality of solar cells 1 are arranged in the matrix structure, so that the hole terminals 11 and the electron terminals 12 of each solar cell 1 are positioned parallel to a side (first side) of a short axis of the solar cell module 100 (i.e., vertical to a side (second side) of a long axis of the solar cell module 100).

The solar cell module 100, in which the plurality of solar cells 1 are connected in series to one another, includes a plurality of first connectors 21 directly connected to the plurality of hole terminals 11, a plurality of second connectors 22 directly connected to the plurality of electron terminals 12, a plurality of third connectors 23 for directly connecting the first connectors 21 of one of the two adjacent solar cells 1 in a column direction to the second connectors 22 of the other of the two adjacent solar cells 1 in the column direction, a plurality of fourth connectors 24 for directly connecting the first connectors 21 of one of the two adjacent solar cells 1 in a row direction to the second connectors 22 of the other of the two adjacent solar cells 1 in the row direction, and a plurality of fifth connectors 25 which are directly connected to the hole terminals 11 of the solar cell 1 (for example, the solar cell 1 positioned on a first column of a first row) and to the electron terminals 12 of the solar cell 1 (for example, the solar cell 1 positioned on a last column of the first row), which are not connected to the electron terminals 12 or the hole terminals 11 of the solar cell 1 adjacent thereto.

In the embodiment of the invention, the first connectors 21, the second connectors 22, the third connectors 23, the fourth connectors 24, and the fifth connectors 25 have substantially the same length and the same width, respectively.

Further, the first to fifth connectors 21 to 25 are formed of the same material. The first to fifth connectors 21 to 25 are generally referred to as a ribbon and are formed of a thin metal plate band, i.e., a conductive tape which contains a conductive material and has a string shape. Examples of the conductive material include at least one selected from the group consisting of nickel (Ni), copper (Cu), silver (Ag), aluminum (Al), tin (Sn), zinc (Zn), indium (In), titanium (Ti), gold (Au), and a combination thereof. A separate adhesive may be used to attach the first to fifth connectors 21 to 25 to the corresponding components, and the adhesive may be applied to the first to fifth connectors 21 to 25.

Each of the plurality of first connectors 21 is connected to the hole terminal 11 positioned on the back surface of the substrate of the solar cell 1. A width of the first connector 21 is less than a width of the hole terminal 11 in an embodiment of the invention, but may be equal to or greater than the width of the hole terminal 11 in another embodiment of the invention. A length of the first connector 21 is greater than a length of the hole terminal 11 in an embodiment of the invention, but may be equal to or less than the length of the hole terminal 11 in another embodiment of the invention.

Each of the plurality of second connectors 22 is connected to the electron terminal 12 positioned on the back surface of the substrate of the solar cell 1. A width of the second connector 22 is less than a width of the electron terminal 12 in an embodiment of the invention, but may be equal to or greater than the width of the electron terminal 12 in another embodiment of the invention. A length of the second connector 22 is greater than a length of the electron terminal 12 in an embodiment of the invention, but may be equal to or less than the length of the electron terminal 12 in another embodiment of the invention.

The plurality of first and second connectors 21 and 22 are positioned parallel to the side of the short axis of the solar cell module 100, and thus are directly positioned on the hole terminals 11 and the electron terminals 12, respectively and parallel to the hole terminals 11 and the electron terminals 12.

Each of the plurality of third connectors 23 is connected to the first connectors 21 of one of the two adjacent solar cells 1 in the column direction and to the second connectors 22 of the other of the two adjacent solar cells 1 in the column direction.

Accordingly, the two adjacent solar cells 1 in the column direction are connected in series to each other using the third connector 23.

The third connector 23 connects the hole terminals 11 of one of the two adjacent solar cells 1 in the column direction to the electron terminals 12 of the other of the two adjacent solar cells 1 in the column direction, thereby connecting the plurality of solar cells 1 arranged in the column direction in series to one another. Therefore, the plurality of third connectors 23 are alternately positioned on the left and right sides of each column of the solar cells.

In other words, the third connector 23 connected to the first and second solar cells 1 positioned adjacent to each other in the column direction is positioned on the same side of the first and second solar cells 1, for example, the left or right side of the first and second solar cells 1.

The plurality of third connectors 23 are positioned parallel to a side of the long axis of the solar cell module 100, and thus are positioned vertical (or perpendicular) to the plurality of first and second connectors 21 and 22.

Each of the plurality of fourth connectors 24 is positioned between the two adjacent solar cells 1 in the row direction. Hence, each fourth connector 24 is connected to the first connectors 21 of one of the two adjacent solar cells 1 in the row direction and to the second connectors 22 of the other of the two adjacent solar cells 1 in the row direction.

Accordingly, the two adjacent solar cells 1 in the row direction are connected in series to each other using the fourth connector 24.

The fourth connector 24 connects the hole terminals 11 of one of the two adjacent solar cells 1 in the row direction to the electron terminals 12 of the other of the two adjacent solar cells 1 in the row direction, thereby connecting the two adjacent solar cells 1 in the row direction in series to each other. Therefore, the plurality of fourth connectors 24 are positioned parallel to the side of the long axis of the solar cell module 100, and thus are positioned vertical (or perpendicular) to the plurality of first and second connectors 21 and 22.

Because each fourth connector 24 is positioned between the first and second solar cells 1 positioned adjacent to each other in the row direction, the fourth connector 24 is positioned on the different sides of the first and second solar cells 1. For example, the fourth connector 24 is positioned between the right side of the first solar cell 1 and the left side of the second solar cell 1.

The third connector 23 connects the two adjacent solar cells 1 in the column direction to each other, and the fourth connector 24 connects the two adjacent solar cells 1 in the row direction to each other. Therefore, a length of the third connector 23 is greater than a length of the fourth connector 24. For example, the length of the third connector 23 may be about two times the length of the fourth connector 24.

The plurality of fifth connectors 25 are connected to the first connectors 21 of the first solar cell 1 (for example, the solar cell 1 positioned on the first row and the first column in FIG. 8) among the plurality of solar cells 1 connected in series to one another and are connected to the second connectors 22 of the last solar cell 1 (for example, the solar cell 1 positioned on the first row and the last column in FIG. 8). In this instance, the plurality of fifth connectors 25 are not connected to the second connectors 22 of the first solar cell 1 and are not connected to the first connectors 21 of the last solar cell 1. Thus, the number of fifth connectors 25 is two.

At least one of the plurality of fifth connectors 25 is connected to a separate adhesive tape and is connected to an external device, for example, a junction box positioned under the solar cell module 100.

Hence, the plurality of solar cells 1 having the matrix structure, which are connected in series to one another using the plurality of first to fourth connectors 21 to 24, are connected to the external device using the fifth connectors 25 and thus output a desired amount of electric current.

In FIG. 8, the structures of the solar cells 1 arranged in the same row are the same as each other, and the structures of the solar cells 1 arranged in the different rows are different.

In addition, in the solar cells 1 positioned on the same row, shapes or arrangements of the first connectors 21 are equal to each other, and shapes or arrangements of the second connectors 22 are equal to each other, but, in the solar cells 1 positioned on the different rows, the shapes or arrangements of the first connectors 21 are different, and the shapes or arrangements of the second connectors 22 are different.

For example, as shown in FIG. 8, for the solar cells positioned in the odd-numbered rows, the first connectors 21 are protruded to the left sides of the solar cells 1 and the second connectors 22 are protruded to the right sides of the solar cells 1, but for the solar cells positioned in the even-numbered rows, the first connectors 21 are protruded to the right sides of the solar cells 1 and the second connectors 22 are protruded to the left sides of the solar cells 1.

As shown in FIG. 8, the third to fifth connectors 23 to 25 are positioned outside each solar cell 1. A portion of the first connector 21 and a portion of the second connector 22 are positioned inside each solar cell 1, and a remaining portion of the first connector 21 and a remaining portion of the second connector 22 are positioned outside each solar cell 1 and thus are connected to one of the third to fifth connectors 23 to 25. In other words, the third to fifth connectors 23 to 25 are positioned outside of each solar cell 1 and are connected to the portion of the first connector 21 and the portion of the second connector 22 which are positioned outside each solar cell 1.

Hence, a distance between the two adjacent solar cells 1 in the column direction decreases, and thus an area of a non-incident surface of (or a non-electricity generating area within) the solar cell module 100 decreases. Further, an area having a color different from the solar cells 1 decreases, and thus a good appearance or aesthetics of the solar cell module 100 is provided.

Because the third to fifth connectors 23 to 25 are not positioned on the solar cells 1, the hole terminals 11 and the electron terminals 12 extend to an edge of the substrate of each solar cell 1. Hence, a formation area of the hole terminals 11 and a formation area of the electron terminals 12 increase. As a result, the efficiency of the solar cells 1 and the efficiency of the solar cell module 100 are improved.

Various examples of a connection structure of the solar cells 1 having the matrix structure according to the embodiment of the invention are described below with reference to FIGS. 9 to 12.

Structures and components identical or equivalent to those illustrated in FIG. 8 are designated with the same reference numerals in FIGS. 9 to 12, and a further description may be briefly made or may be entirely omitted.

Figure 9:
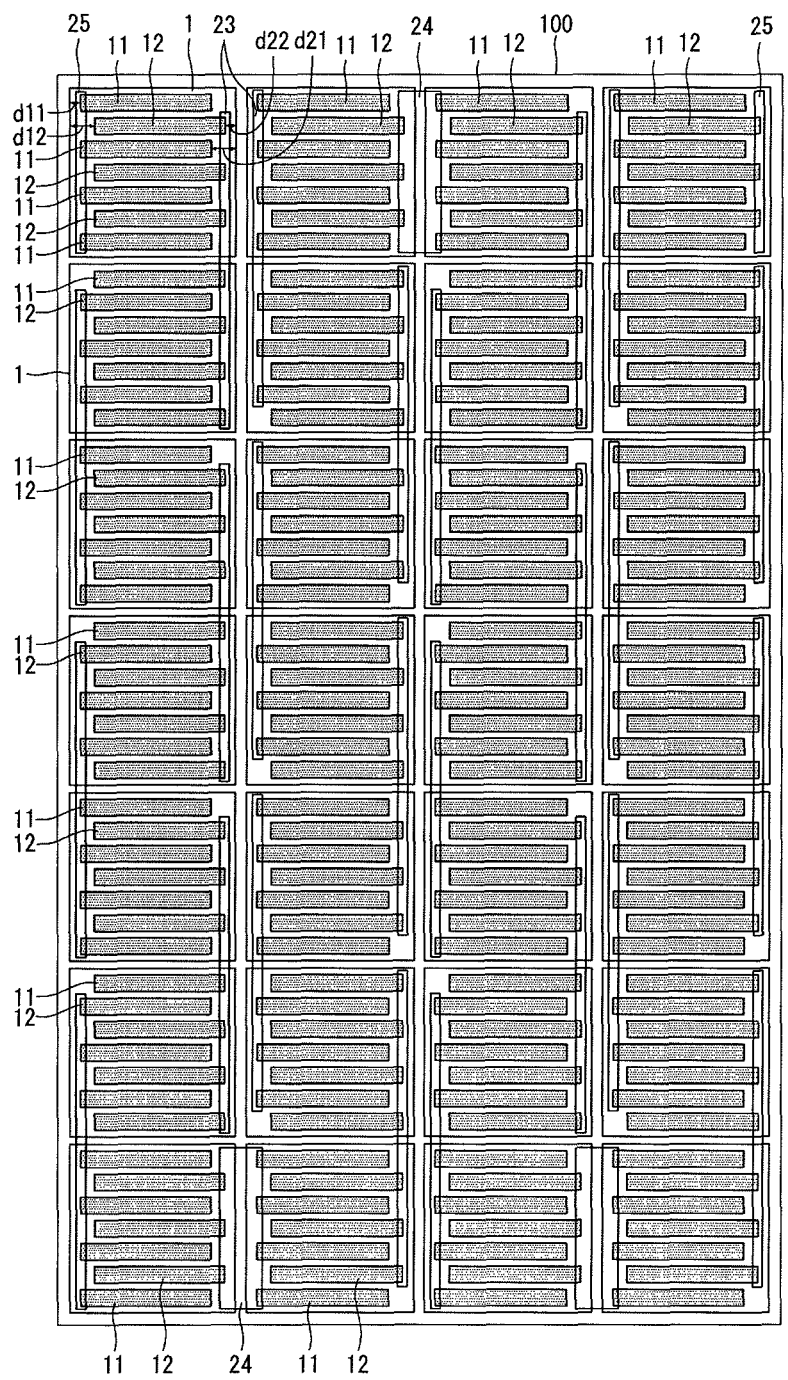

Unlike the connection structure illustrated in FIG. 8, a connection structure illustrated in FIG. 9 uses the third to fifth connectors 23 to 25 without the use of the first and second connectors 21 and 22.

The plurality of hole terminals 11 and the plurality of electron terminals 12 are directly connected to the third to fifth connectors 23 to 25, and not through the first and second connectors 21 and 22. Thus, a portion of each of the third to fifth connectors 23 to 25 is positioned inside (or to overlap) the solar cell 1, and a remaining portion (i.e., a portion of each of the third to fifth connectors 23 to 25 positioned between the solar cells 1) is positioned outside (or to not overlap) the solar cell 1.

The structure of each solar cell 1 shown in FIG. 8 is different from the structure of each solar cell 1 shown in FIG. 9 in a disposition shape of the hole terminals 11 and the electron terminals 12.

As shown in FIG. 8, an end of the hole terminal 11 and an end of the electron terminal 12 are positioned on the same straight line or are aligned. Therefore, a distance between the adjacent surface of the solar cell 1 and the end of the hole terminal 11 is substantially equal to a distance between the adjacent surface of the solar cell 1 and the end of the electron terminal 12.

However, as shown in FIG. 9, distances d11 and d21 between the adjacent surface of the solar cell 1 and the end of the hole terminal 11 are different from distances d12 and d22 between the adjacent surface of the solar cell 1 and the end of the electron terminal 12.

More specifically, as shown in FIG. 9, the third connectors 23 are alternately positioned on the left and right sides of the column of the solar cells. Therefore, one of the hole terminal 11 and the electron terminal 12 connected to the third connector 23 positioned on the left side of the column of the solar cells is positioned closer to the side of the solar cell 1 adjacent to the third connector 23 than the other terminal. On the contrary, one of the electron terminal 12 and the hole terminal 11 connected to the third connector 23 positioned on the right side of the column of the solar cells is positioned closer to the side of the solar cell 1 adjacent to the third connector 23 than the other terminal.

Accordingly, one of the hole terminal 11 and the electron terminal 12 connected to the third connector 23 is positioned closer to one side of the solar cell 1 adjacent to the third connector 23 than the other terminal. Hence, the third connector 23 is connected to one of the hole terminal 11 and the electron terminal 12 that is disposed closer to the adjacent side of the solar cell 1 in a straight line without a bend. As a result, the attachment between the third connector 23 and the hole terminal 11 or the electron terminal 12 is easily and quickly carried out.

In FIG. 9, the two adjacent solar cells 1 in the row direction have the same structure and the solar cells 1 positioned on the different rows are arranged with the different structures.

For example, in FIG. 9, in the solar cells positioned on the odd-numbered rows, the hole terminals 11 are protruded to the left sides of the solar cells and the electron terminals 12 are protruded to the right sides of the solar cells 1, and in the solar cells positioned on the even-numbered rows, the hole terminals 11 are protruded to the right sides of the solar cells and the electron terminals 12 are protruded to the left sides of the solar cells 1. Thereby, in the plurality of solar cells 1 positioned on the same row, the terminals (11 or 12) adjacent to the left sides of the solar cells 1 may be the same terminal (for example, the hole terminals 11), and the terminals (12 or 11) adjacent to the right sides of the solar cells 1 may be the same terminal (for example, the electron terminals 12).

Hence, the fourth connector 24 for connecting the first and second solar cells 1 positioned adjacent to each other in the row direction is positioned between the first and second solar cells 1 and is connected to the different terminals (for example, the electron terminals 12 of further protruding to the right side of the first solar cell 1 and the hole terminals 11 further protruding to the left side of the second solar cell 1) further protruding to the fourth connector 24.

However, the two adjacent solar cells 1 in the column direction each have the different structure or arrangement. Namely, the structures of the two adjacent solar cells 1 in the column direction have a rotation relationship of 180°. Hence, in the plurality of solar cells 1 positioned on the different rows, the terminals (11 or 12) adjacent to the left sides of the solar cells 1 may be the different terminals, and the terminals (12 or 11) on the right sides adjacent to the right sides of the solar cells 1 may be the different terminals.

For example, as shown in FIG. 9, in the plurality of solar cells 1 positioned on the odd-numbered rows, the terminals adjacent to the left sides of the solar cells 1 are the hole terminals 11, and the terminals adjacent to the right sides of the solar cells 1 are the electron terminals 12. Further, in the plurality of solar cells 1 positioned on the even-numbered rows, the terminals adjacent to the left sides of the solar cells 1 are the electron terminals 12, and the terminals adjacent to the right sides of the solar cells 1 are the hole terminals 11.

In the structure of the solar cell module 100 illustrated in FIG. 9, the plurality of first and second connectors 21 and 22 connected to the plurality of hole terminals 11 and the plurality of electron terminals 12 are not necessary. Therefore, the manufacturing cost and manufacturing time of the solar cell module 100 are greatly reduced.

Further, because the distance between the adjacent solar cells 1 in the row direction as well as the column direction decreases, the better appearance or aesthetics of the solar cell module 100 is provided and the size of the solar cell module 100 is reduced.

In an example of the embodiment of the invention, similar to the structure of FIG. 8, the plurality of first connectors 21 connected to the plurality of hole terminals 11 and the plurality of second connectors 22 connected to the plurality of electron terminals 12 may be positioned or provided, and the plurality of first and second connectors 21 and 22 may be connected to the plurality of third connectors 23. On the other hand, unlike the structure of FIG. 8, the plurality of first and second connectors 21 and 22 are positioned only inside (or to overlap) the corresponding solar cell and do not protrude to the outside of the corresponding solar cell. In this instance, because the third connectors 23 are connected to the first and second connectors 21 and 22 connected to the terminals 11 and 12, an amount of carriers output to the third connectors 23 through the terminals 11 and 12 increases. Hence, the efficiency of the solar cell module is improved.

Another serial connection structure of the plurality of solar cells 1 having the matrix structure according to the embodiment of the invention is described below with reference to FIGS. 10 to 12.

Figure 10:
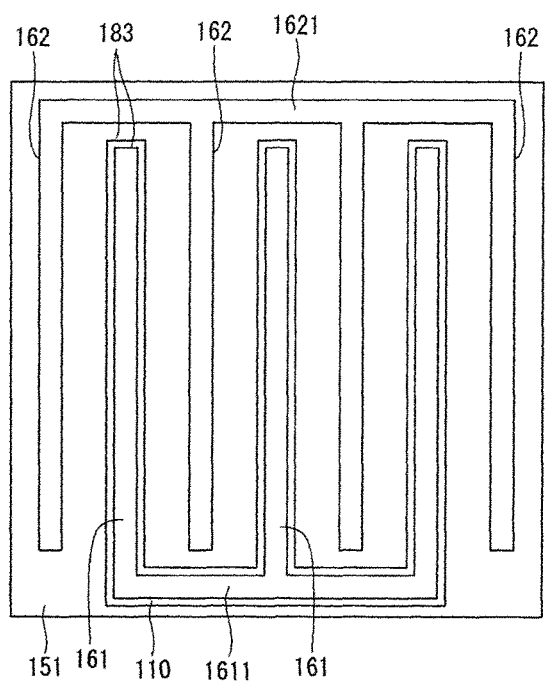
FIG. 10 schematically illustrates another back structure of the MWT solar cell shown in FIG. 2.
Figure 11:
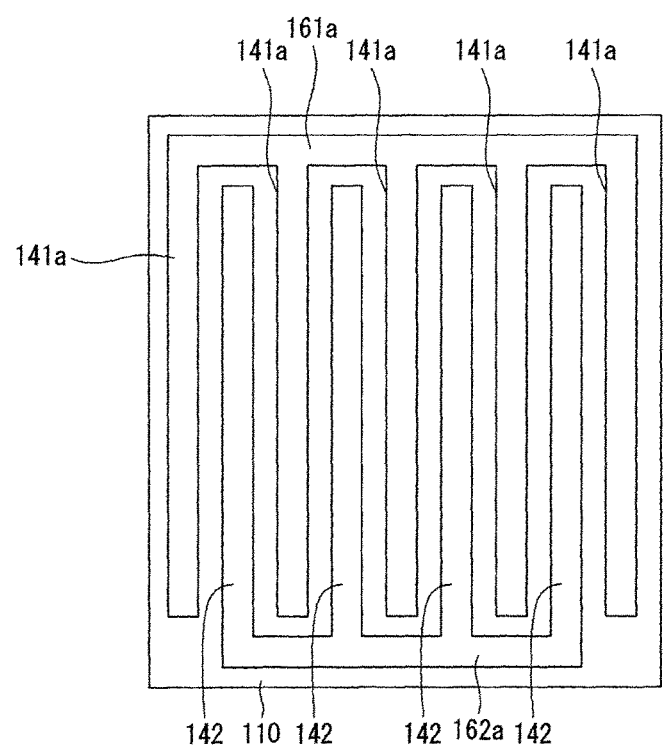
FIG. 11 schematically illustrates another back structure of the IBC solar cell shown in FIG. 5.
Figure 12:
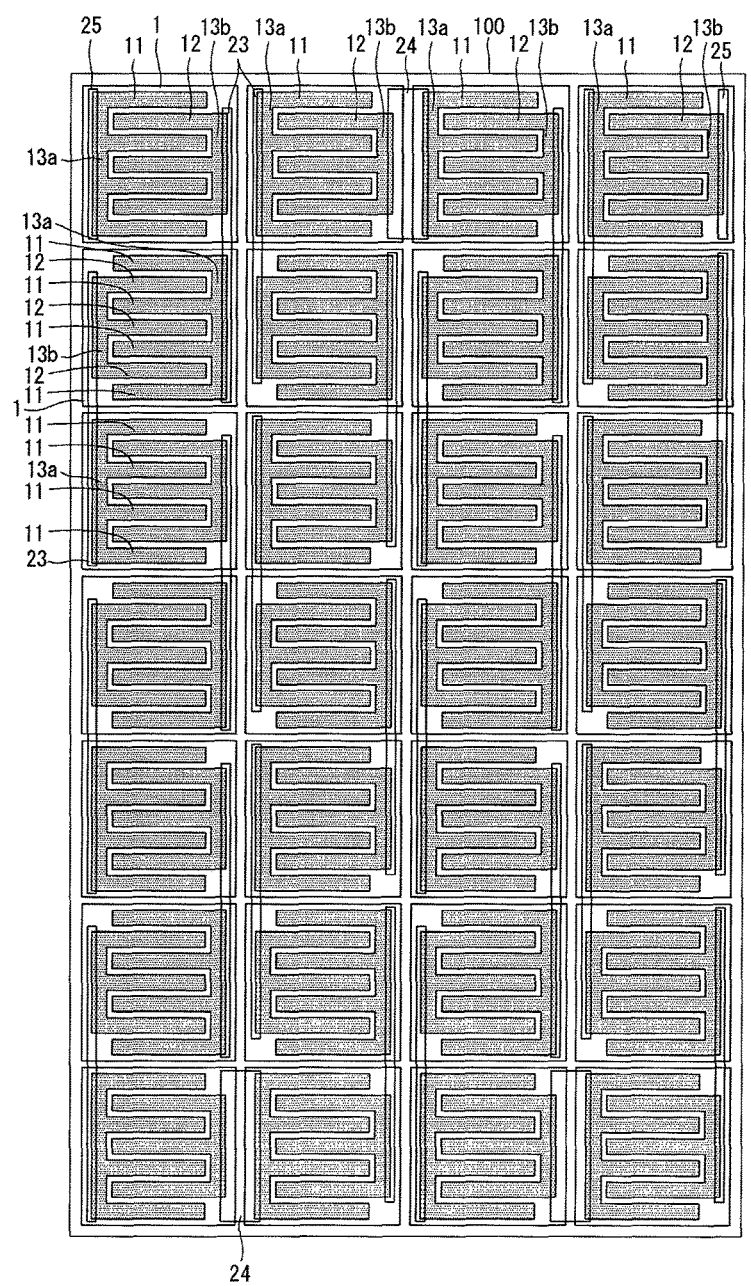
FIG. 12 illustrates an example of a connection structure of a back contact solar cell having the back structure illustrated in FIGS. 10 and 11.

When the plurality of solar cells 1 are connected in series to one another, a back structure of the back contact solar cell shown in FIGS. 10 to 12 is different from the back structure of the back contact solar cell shown in FIGS. 4 and 7.

More specifically, the MWT back contact solar cell shown in FIG. 10 further includes a first common current collector 1611 connected to the front electrode current collectors 161 and a second common current collector 1621 connected to the back electrode current collectors 162, unlike the back contact solar cell shown in FIG. 4.

Hence, the front electrode current collectors 161 are connected to one another using the first common current collector 1611, and the back electrode current collectors 162 are connected to one another using the second common current collector 1621. In this instance, the expositing portions 183 for separating the back electrodes 151 from the front electrode current collectors 161 surround the front electrode current collectors 161 and the first common current collector 1611 connected to the front electrode current collectors 161.

Further, the IBC back contact solar cell or the back contact heterojunction solar cell shown in FIG. 11 further includes a first current collector 161a connected to the first electrodes 141a and a second current collector 162a connected to the second electrodes 142, unlike the back contact solar cell shown in FIG. 7.

In FIGS. 10 and 11, the first common current collector 1611, the first current collector 161a, the second common current collector 1621, and the second current collector 162a respectively extend in a direction crossing the respective front electrode current collectors 161, the first electrodes 141a, the back electrode current collectors 162, and the second electrodes 142 and also extend parallel to the adjacent surface (for example, a top surface or a bottom surface in the solar cell of FIG. 10 or 11). In this instance, the first common current collector 1611 and the second common current collector 1621 are positioned on the opposite sides of the solar cell 1, and the first current collector 161a and the second current collector 162a are positioned on the opposite sides of the solar cell 1.

The first and second common current collectors 1611 and 1621 are formed of the same material as the current collectors 161 and 162, and the first and second current collectors 161a and 162a are formed of the same material as the first and second electrodes 141a and 142. In this instance, the current collectors 161 and 162 are formed along with the first and second common current collectors 1611 and 1621 at a corresponding location of the substrate of the solar cell 1. Further, the first and second electrodes 141a and 142 are formed along with the first and second current collectors 161a and 162a at a corresponding location of the substrate of the solar cell 1.

The first and second common current collectors 1611 and 1621 are respectively connected to the current collectors 161 and 162, and thus collect carriers collected by the current collectors 161 and 162.

Further, the first and second current collectors 161a and 162a are respectively connected to the first and second electrodes 141a and 142, and thus collect carriers collected by the first and second electrodes 141a and 142.

When each solar cell 1 has the back structure illustrated in FIGS. 10 and 11, the plurality of solar cells 1 arranged in the matrix structure are connected in series to one another using only the third to fifth connectors 23 to 25 as shown in FIG. 12. As described above with reference to FIG. 9, a portion of each of the third to fifth connectors 23 to 25 is positioned inside (or to overlap) the solar cell 1, and a remaining portion of each of the third to fifth connectors 23 to 25 positioned between the adjacent solar cells 1 is positioned outside (or to not overlap) the solar cell 1.

Unlike the structure illustrated in FIG. 9, the third to fifth connectors 23 to 25 are not connected to the hole terminals 11 and the electron terminals 12, and are connected to one of the first and second common current collectors 1611 and 1621 and one of the first and second current collectors 161a and 162a.

When each solar cell 1 shown in FIG. 12 is the MWT solar cell, one (which collects holes) of the first and second common current collectors 1611 and 1621 is referred to as a hole current collector 13a, and the other common current collector which collects electrons is referred to as an electron current collector 13b.

Further, when each solar cell 1 shown in FIG. 12 is the IBC solar cell or the back contact heterojunction solar cell, one (which collects holes) of the first and second current collectors 161a and 162a is referred to as the hole current collector 13a, and the other current collector which collects electrons is referred to as the electron current collector 13b.

Hence, electrons and holes collected by each solar cell 1 move and are output to the external device, such as the junction box, through the third to fifth connectors 23 to 25 connected to the hole current collector 13a or the electron current collector 13b.

Because a contact area between the third to fifth connectors 23 to 25 and the hole current collector 13a or the electron current collector 13b increases as compared to the structure illustrated in FIG. 9, an amount of carriers output from the hole current collector 13a or the electron current collector 13b to the third to fifth connectors 23 to 25 increases.

Similar to the structure illustrated in FIG. 9, in the plurality of solar cells 1 of the matrix structure shown in FIG. 12, the solar cells 1 positioned on the same row have the same structure, and the two adjacent solar cells 1 in the column direction have the different structures. The two adjacent solar cells 1 in the column direction have a rotation relationship of 180°. Hence, the hole terminals 11 are adjacently positioned to the left side of each of the solar cells 1 positioned on the odd-numbered rows, and the electron terminals 12 are adjacently positioned to the right side thereof. Further, the hole terminals 11 are adjacently positioned to the right side of each of the solar cells 1 positioned on the even-numbered rows, and the electron terminals 12 are adjacently positioned to the left side thereof.

When the plurality of solar cells 1 having the above-described structure are connected in series to one another, the transparent member 40, the upper and lower protective layers 20a and 20b, the plurality of solar cells 1, and the back sheet 30 are disposed in a fixed order. Then, predetermined heat and pressure are applied to them to perform a laminating process. Hence, the solar cell module 100 is formed. More specifically, the upper and lower protective layers 20a and 20b are melted by the heat and thus are filled in a space between the components. Hence, the transparent member 40, the upper protective layer 20a, the plurality of solar cells 1, the lower protective layer 20b, and the back sheet 30 are attached to one another and form an integral body. Thus, the upper and lower protective layers 20a and 20b form one protective member through the laminating process, and the plurality of solar cells 1 are surrounded by the protective member and are protected from the external impact and moisture.

Next, the frame 60 is installed at the edge of the solar cell module 100, thereby completing the solar cell module 100. In this instance, the frame 60 is formed of a material, for example, aluminum coated with an insulating material that does not generate corrosion, deformation, etc., under influence of the external environment. The frame 60 has the structure in which the drainage process, the installation, and the execution are easily performed. The frame 60 may be omitted, if desired.

In an alternative example, the first to fifth connectors 21 to 25 shown in FIGS. 8 to 12 may be formed of a conductive adhesive film.

The conductive adhesive film may include a resin and conductive particles distributed into the resin. A material of the resin is not particularly limited as long as it has the adhesive property. It is preferable, but not required, that a thermosetting resin is used for the resin so as to increase the adhesive reliability.

The thermosetting resin may use at least one selected among epoxy resin, phenoxy resin, acryl resin, polyimide resin, and polycarbonate resin.

The resin may further contain a predetermined material, for example, a known curing agent and a known curing accelerator other than (or in addition to) the thermosetting resin.

For example, the resin may contain a reforming material such as a silane-based coupling agent, a titanate-based coupling agent, and an aluminate-based coupling agent, so as to improve an adhesive strength between a conductive pattern part and the solar cells 1. The resin may contain a dispersing agent such as calcium phosphate and calcium carbonate, so as to improve the dispersibility of the conductive particles. The resin may contain a rubber component such as acrylic rubber, silicon rubber, and urethane rubber, so as to control the modulus of elasticity of the conductive adhesive film.

A material of the conductive particles is not particularly limited as long as it has the conductivity. The conductive particles may contain at least one metal selected among copper (Cu), silver (Ag), gold (Au), iron (Fe), nickel (Ni), lead (Pb), zinc (Zn), cobalt (Co), titanium (Ti), and magnesium (Mg) as the main component. The conductive particles may be formed of only metal particles or of metal-coated resin particles. The conductive adhesive film having the above-described configuration may further include a peeling film.

It is preferable, but not required, that the conductive particles use the metal-coated resin particles, so as to mitigate a compressive stress of the conductive particles and improve the connection reliability of the conductive particles.

It is preferable, but not required, that the conductive particles have a diameter of about 2 µm to 30 µm, so as to improve the dispersibility of the conductive particles.

It is preferable, but not required, that a composition amount of the conductive particles distributed into the resin is about 0.5% to 20% based on the total volume of the conductive adhesive film in consideration of the connection reliability after the resin is cured. When the composition amount of the conductive particles is equal to or greater than about 0.5%, the current more smoothly flows because a physical contact between the conductive adhesive part and the front electrodes is more stably achieved. When the composition amount of the conductive particles is equal to or less than about 20%, the adhesive strength is stably maintained and the current more smoothly flows because a composition amount of the resin is normally maintained.

A solar cell module 100a according to another example embodiment of the invention is described below with reference to FIGS. 13 to 15.

Figure 13:
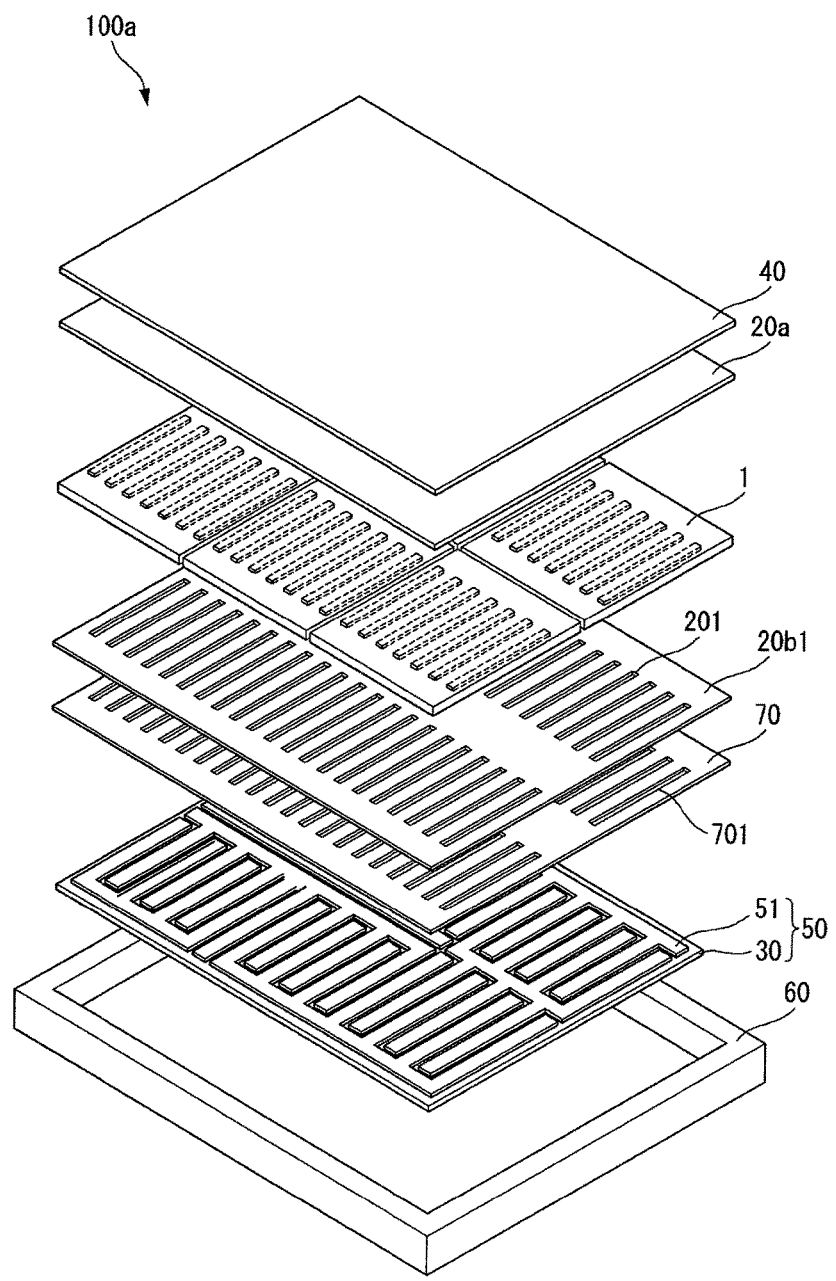
FIG. 13 is a schematic perspective view of a solar cell module according to another example embodiment of the invention.
Figure 14:
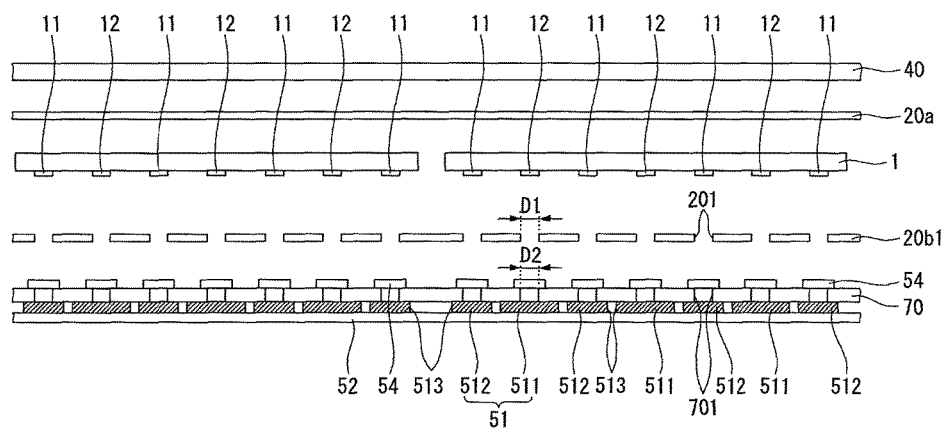
FIG. 14 is a partial cross-sectional view of the solar cell module shown in FIG. 13 before a lamination process is performed.
Figure 15:
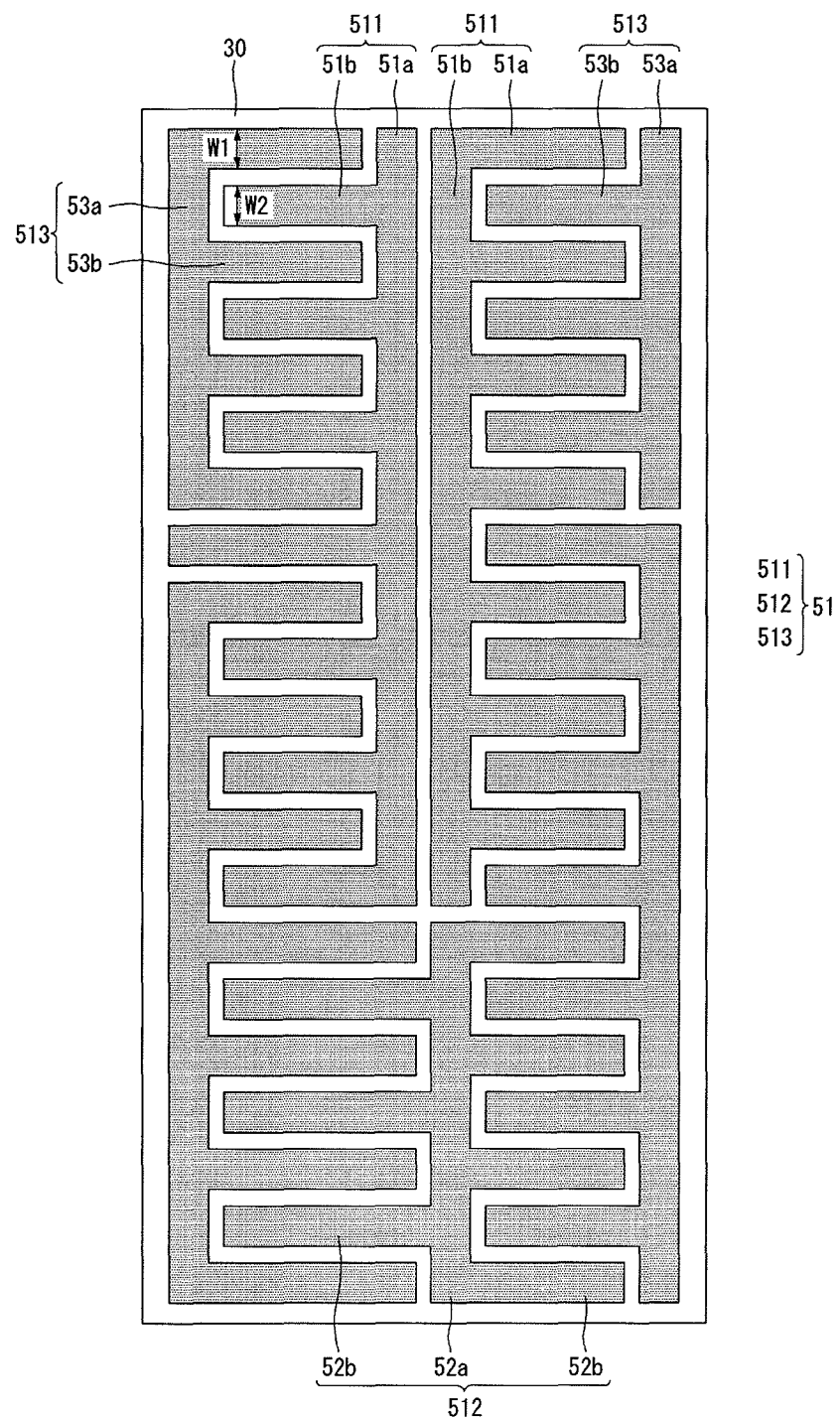
FIG. 15 is a schematic plane view of a conductive pattern part of the solar cell module shown in FIG. 13.

Structures and components identical or equivalent to those illustrated in FIGS. 1 to 12 are designated with the same reference numerals in the solar cell module shown in FIGS. 13 to 15, and a further description may be briefly made or may be entirely omitted.

As shown in FIG. 13, the solar cell module 100a according to the embodiment of the invention includes a plurality of solar cells 1, upper and lower protective layers 20a and 20b1 for protecting the solar cells 1, a transparent member 40 positioned on the upper protective layer 20a, a back sheet 30 positioned with the lower protective layer 20b1, a pattern forming part 50 positioned under the back sheet 30, and a frame 60, similar to the solar cell module 100 shown in FIG. 1.

The solar cell module 100a further includes an insulating sheet 70 between the lower protective layer 20b1 and the back sheet 30 and a conductive pattern part 51 on the back sheet 30.

The lower protective layer 20b1 has a plurality of openings 201 unlike the upper protective layer 20a, and thus has a structure different from the upper protective layer 20a.

The plurality of openings 201 are positioned at a location corresponding to hole terminals 11 and electron terminals 12 of each solar cell 1. At least a portion of each hole terminal 11 and at least a portion of each electron terminal 12 are exposed through the openings 201. A width of each opening 201 is equal to or less than widths of each hole terminal 11 and each electron terminal 12. Alternatively, the width of each opening 201 may be greater than the widths thereof.

The insulating sheet 70 between the lower protective layer 20b1 and the pattern forming part 50 is formed of an insulating material and provides an electrical insulation between the lower protective layer 20b1 and the pattern forming part 50. The insulating sheet 70 has a plurality of openings 701. The plurality of openings 701 are positioned at a location corresponding to the plurality of openings 201 of the lower protective layer 20b1. Thus, at least a portion of each hole terminal 11 and at least a portion of each electron terminal 12 are exposed through the openings 701.

As shown in FIG. 14, a width D2 of the opening 701 of the insulating sheet 70 is substantially equal to a width D1 of the opening 201 of the lower protective layer 20b1. However, the width D2 and the width D1 may be different from each other. For example, the width D2 of the opening 701 of the insulating sheet 70 may be less or greater than the width D1 of the opening 201 of the lower protective layer 20b1.

The openings 201 and 701 have lengths and widths corresponding to lengths and widths of the hole terminals 11 and the electron terminals 12 opposite the openings 201 and 701 and thus have a stripe shape elongated (or extending) in a fixed direction.

Alternatively, at least one of the openings 201 and 701 may have the structure in which a plurality of holes are arranged along the extending direction of the hole terminals 11 and the electron terminals 12. Each hole may have various cross-sectional shapes such as a circle, a polygon and an oval, and a distance between the holes may be uniform or non-uniform. Further, the size and the number of holes may be determined depending on the length and the width of the hole terminals 11 and the electron terminals 12.

In this instance, the hole terminals 11 and the electron terminals 12 may be exposed through the holes.

As shown in FIGS. 13 and 14, the back sheet 30 and the conductive pattern part 51 on the back sheet 30 form the pattern forming part 50.

The conductive pattern part 51 is positioned on the back sheet 30. In the embodiment of the invention, the conductive pattern part 51 is formed of copper (Cu). Other conductive materials may be used. For example, the conductive pattern part 51 may be formed of silver (Ag), aluminum (Al), or nickel (Ni), etc.

Another conductive layer may be formed on the conductive pattern part 51 by coating a conductive material on the conductive pattern part 51, so as to improve the conductivity of the conductive pattern part 51 and contact characteristic between the conductive pattern part 51 and the solar cells 1. The conductive pattern part 51 and the conductive layer may be formed of the same conductive material or different conductive materials each having different characteristic. When the conductive pattern part 51 and the conductive layer are formed of the different conductive materials, the conductivity of the conductive layer may be more excellent (or improved) than the conductivity of the conductive pattern part 51 alone. In this instance, the conductive pattern part 51 may be formed of Al or Ni, etc., and the conductive layer on the conductive pattern part 51 may be formed of Au or Ag, etc.

As shown in FIG. 15, the conductive pattern part 51 includes a plurality of first patterns 511 connected to the hole terminals 11 and the electron terminals 12 of the two adjacent solar cells 1 in a column direction, a plurality of second patterns 512 connected to the hole terminals 11 and the electron terminals 12 of the two adjacent solar cells 1 in a row direction, and a plurality of third patterns 513 connected to the hole terminals 11 or the electron terminals 12.

Because the conductive pattern part 51 is positioned on the back sheet 30 formed of the insulating material, the back sheet 30 is exposed to a portion of the first to third patterns 511 to 513, on which the conductive pattern part 51 is not positioned.

The first to third patterns 511 to 513 respectively include bodies 51a, 52a, and 53a, which elongate to (or extends on) one surface (for example, the side of a long axis) of the back sheet 30 or in the column direction of the solar cell module 100a, and a plurality of branches 51b, 52b, and 53b which extend from the bodies 51a, 52a, and 53a to another surface (for example, the side of a short axis) of the back sheet 30 or in the row direction of the solar cell module 100a.

As shown in FIG. 15, the plurality of branches 51b, 52b, and 53b of the first to third patterns 511 to 513 extend from the bodies 51a, 52a, and 53a and thus have a comb teeth structure. The bodies 51a, 52a, and 53a of the first to third patterns 511 to 513 elongate in (or extends in) a direction (for example, a vertical direction) crossing the hole terminals 11 and the electron terminals 12.

The first to third patterns 511 to 513 are separated from one another and are electrically insulated from one another.

Each of the branches 51b, 52b, and 53b is divided into a first branch connected to the hole terminal 11 and a second branch connected to the electron terminal 12.

In the first to third patterns 511 to 513, widths w1 of the first branches 51b, 52b, and 53b connected to the hole terminals 11 are substantially equal to one another, and widths w2 of the second branches 51b, 52b, and 53b connected to the electron terminals 12 are substantially equal to one another. In the embodiment of the invention, the widths w1 of the first branches 51b, 52b, and 53b connected to the hole terminals 11 are different from the widths w2 of the second branches 51b, 52b, and 53b connected to the electron terminals 12. However, the width w1 may be substantially equal to the width w2.

The widths w1 and w2 of the branches 51b, 52b, and 53b may be determined depending on the number of hole terminals 11 and the number of electron terminals 12. For example, as the number of terminals 11 and 12 increases, an amount of current flowing through the branches 51b, 52b, and 53b decreases. Thus, as an amount of current flowing through the branches 51b, 52b, and 53b (i.e., an amount of load) decreases, the widths w1 and w2 of the branches 51b, 52b, and 53b decrease. In the embodiment of the invention, because the four hole terminals 11 and the three electron terminals 12 are positioned (or exist), the widths w2 of the second branches 51b, 52b, and 53b connected to the electron terminals 12 are greater than the widths w1 of the first branches 51b, 52b, and 53b connected to the hole terminals 11.

In an alternative example, when the number of hole terminals 11 is equal to the number of electron terminals 12, the widths w1 of the first branches 51b, 52b, and 53b connected to the hole terminals 11 may be substantially equal to the widths w2 of the second branches 51b, 52b, and 53b connected to the electron terminals 12.

Lengths L1 to L3 of the branches 51b, 52b, and 53b of the first to third patterns 511 to 513 are determined depending on lengths of the hole terminal 11 and the electron terminal 12. In the embodiment of the invention, the lengths L1 to L3 of the branches 51b, 52b, and 53b are substantially equal to one another.

The plurality of first patterns 511 connect the hole terminals 11 of one of the plurality of solar cells 1 arranged in the column direction to the electron terminals 12 of another solar cell 1 adjacent to (i.e., in front of or behind) the one solar cell 1.

The plurality of first patterns 511 are alternately positioned on the left and right sides of the solar cells 1 positioned on the same column.

More specifically, the first pattern 511 positioned on the left side of the two adjacent solar cells 1 in the column direction is connected to the hole terminals 11 or the electron terminals 12 of one of the two adjacent solar cells 1, and the electron terminals 12 or the hole terminals 11 of the other of the two adjacent solar cells 1. The first pattern 511 positioned on the right side of the two adjacent solar cells 1 in the column direction is connected to the electron terminals 12 or the hole terminals 11 of one of the two adjacent solar cells 1, and is connected to the hole terminals 11 or the electron terminals 12 of the solar cell 1 adjacent to (i.e., in front of or behind) the one solar cell 1.

Accordingly, the solar cells 1 positioned on the same column are electrically connected in series to one another using the plurality of first patterns 511.

The plurality of second patterns 512 are connected to the hole terminals 11 and the electron terminals 12 (not connected to the two adjacent solar cells 1 in the column direction) of the two solar cells 1 positioned on a first row of two adjacent rows of the solar cells 1 or the two solar cells 1 positioned on a last row thereof.

The solar cells 1 positioned on the different columns are electrically connected in series to one another using the plurality of second patterns 512.

The plurality of third patterns 513 are connected to the hole terminals 11 or the electron terminals 12 of the solar cell 1 (for example, the solar cell 1 positioned on a first row and a first column), which is not connected to the hole terminals 11 or the electron terminals 12 of the solar cell 1 adjacent thereto, among the solar cells 1 positioned on the first column; and are connected to the hole terminals 11 or the electron terminals 12 of the solar cell 1 (for example, the solar cell 1 positioned on the first row and a last column), which is not connected to the electron terminals 12 or the hole terminals 11 of the solar cell 1 adjacent thereto, among the solar cells 1 positioned on the last column.

Thus, the number of third patterns 513 is two.

The bodies 53a of the plurality of third patterns 513 are connected to a conductive tape and are connected to an external device, for example, a junction box positioned under the solar cell module 100a.

The plurality of solar cells 1 having the matrix structure, which are connected in series to one another using the plurality of first and second patterns 511 and 512, are connected to the external device using the third patterns 513 and thus output a desired amount of electric current.

As shown in FIG. 14, conductive adhesive parts 54 are positioned on the openings 701 of the insulating sheet 70. The conductive adhesive parts 54 are filled in the openings 201 and 701 because of heat generated when the lamination process is performed. Hence, the terminals 11 and 12 exposed through the openings 201 and 701 contact the conductive pattern part 51 by the conductive adhesive parts 54 positioned in the openings 201 and 701.

The conductive adhesive part 54 may be formed of the above-described conductive adhesive film, a conductive paste, a conductive epoxy, etc.

The branches 51b, 52b, and 53b of the first to third patterns 511 to 513 of the conductive pattern part 51 on the back sheet 30 are connected to the hole terminals 11 and the electron terminals 12 exposed through the openings 201 and 701. Hence, the solar cells 1 having the matrix structure are electrically connected in series to one another, and thus carriers output from the solar cells 1 are output to the external device. As a result, an amount of current flows therein.

In the embodiment of the invention, the plurality of solar cells 1 are positioned at a corresponding location of the conductive pattern part 51 including the first to third patterns 511 to 513, and then heat and pressure are applied to the plurality of solar cells 1. Hence, the plurality of solar cells 1 are electrically connected to the conductive pattern part 51. As a result, the plurality of solar cells 1 are automatically connected in series to one another.

In other words, the insulating sheet 70 is positioned on the conductive pattern part 51, and the conductive adhesive part 54 is positioned at a location corresponding to a formation location of the insulating sheet 70. Then, the lower protective layer 20b1 is positioned on the insulating sheet 70. Next, the plurality of solar cells 1 are positioned at a uniform distance therebetween, the upper protective layer 20a is arranged on the solar cells 1, and the transparent member 40 is positioned on the upper protective layer 20a. Next, the lamination process is performed to form an integral body of the above components.

Further, the conductive adhesive part 54 is filled in the openings 201 and 701 because of the heat generated when the lamination process is performed. The hole terminals 11 and the electron terminals 12 of each solar cell 1 are connected to the conductive pattern part 51 of the pattern forming part 50 by the conductive adhesive part 54.

Thus, instead of a process in which a conductive film is cut and then the conductive tape (i.e., the plurality of connectors 21 to 25) is attached to the hole terminals 11 and the electron terminals 12 of the plurality of solar cells 1, the electrical connection of the plurality of solar cells 1 is automatically completed using the conductive pattern part 51 having a desired pattern when the lamination process is completed. As a result, manufacturing time of the solar cell module 100a is reduced, and thus the production efficiency of the solar cell module 100a is improved.

FIGS. 13 to 15 illustrate that the conductive pattern part 51 and the back sheet 30 are manufactured to form an integral body, i.e., the pattern forming part 50. In this instance, the conductive pattern part 51 is formed by forming a conductive layer formed of copper (Cu), etc. on the back sheet 30, patterning the conductive layer in a desired shape using a dry etching method or a wet etching method, etc., and forming the conductive layer having the desired shape on the back sheet 30.

Alternatively, the conductive pattern part 51 and the back sheet 30 may be manufactured as separate parts. In this instance, the conductive pattern part 51, which is patterned in a desired shape to have a sheet form, is positioned on the back sheet 30 of a sheet form as the separate part. Further, a formation location of the conductive pattern part 51 is determined in consideration of formation locations of the openings 201 of the lower protective layer 20b1 and the openings 701 of the insulating sheet 70. Hence, when the conductive pattern part 51 and the back sheet 30 are manufactured as the separate parts, only the back sheet 30 serves as a back sheet.

In an alternative example, the insulating sheet 70 and the pattern forming part 50 may be manufactured to form an integral body. In this instance, the pattern forming part 50 may include the insulating sheet 70, the conductive pattern part 51, and the back sheet 30.

FIG. 14 shows the conductive adhesive part 54 positioned on the insulating sheet 70. However, the conductive adhesive part 54 may be positioned on the lower protective layer 20b1 or on the insulating sheet 70 and the conductive pattern part 51. When the conductive adhesive part 54 is positioned on the lower protective layer 20b1, the conductive adhesive part 54 may be positioned on the openings 201 of the lower protective layer 20b1. When the conductive adhesive part 54 is positioned on the conductive pattern part 51, the conductive adhesive part 54 may be positioned at a location corresponding to the openings 701 of the insulating sheet 70.

As shown in FIG. 15, each of the branches 51b, 52b, and 53b has an angular edge. However, in other embodiments, the edge of each of the branches 51b, 52b, and 53b may have a curved shape. When the edge of each of the branches 51b, 52b, and 53b has the angular shape, carriers may concentrate in an angular portion (i.e., the angular edge) of each of the branches 51b, 52b, and 53b. Hence, the carriers may not be uniformly distributed in each of the branches 51b, 52b, and 53b, and the problem such as an arc may be caused. However, when the edge of each of the branches 51b, 52b, and 53b has the curved shape, the carriers may be uniformly distributed in each of the branches 51b, 52b, and 53b. Hence, the electrical problem such as the arc may be prevented or reduced.

The above-described method illustrated in FIGS. 13 to 15, in which the conductive pattern part 51 of the desired shape is formed on the back sheet 30 at a location corresponding to the openings 201 of the lower protective layer 20b1 and the openings 701 of the insulating sheet 70, and the plurality of solar cells 1 are electrically connected to one another in the lamination process, may be applied to the configuration of FIG. 8.

Namely, the third to fifth connectors 23 to 35 shown in FIG. 8 are formed on the back sheet 30 as the conductive pattern part 51, and then the openings of the insulating sheet 70 and the lower protective layer 20b1 are formed at the location corresponding to the formation location of the third to fifth connectors 23 to 35.

In this instance, since the configuration of FIG. 8 is substantially the same as the embodiment illustrated in FIGS. 13 to 15 except the shape and the formation location of the conductive pattern part 51 and the shape and the formation location of the openings 701 and 201 of the insulating sheet 70 and the lower protective layer 20b1, a further description will not repeated.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell module comprising:
a plurality of strings arranged in a line direction and electrically connected to each other, the plurality of strings having a plurality of solar cells including a first solar cell and a second solar cell positioned adjacent to each other in a column direction, and a third solar cell and a fourth solar cell positioned at ends of two strings adjacent to each other of the plurality of strings;
a third connector having a stripe shape extended in the column direction and configured to connect hole terminals or electron terminals of the first solar cell to electron terminals or hole terminals of the second solar cell;
a fourth connector positioned between the two strings adjacent to each other and having a stripe shape extended in the column direction, and configured to connect hole terminals or electron terminals of the third solar cell to electron terminals or hole terminals of the fourth solar cell;
a first protective layer positioned on incident surfaces of the plurality of solar cells;
a transparent member positioned on the first protective layer; and
a second protective layer positioned on surfaces opposite the incident surfaces of the plurality of solar cells,
wherein each of the hole terminals and each of the electron terminals of each solar cell of the first to fourth solar cells are positioned on a back surface of a substrate of the each solar cell, and is extended seamlessly in the line direction parallel to each other,
wherein the each of the hole terminals of the each solar cell is separated from each other, and the each of the electron terminals of the each solar cell is separated from each other,
wherein each of the first to fourth solar cells has the same terminal structure,
wherein each of the first and second solar cells is arranged to have a rotation relationship of 180° so that the hole terminals or electron terminals of the first solar cell and the electron terminals or hole terminals of the second solar cell are connected to the third connector,
wherein each of the third and fourth solar cells is arranged to have a rotation relationship of 0° or 360° so that the hole terminals or electron terminals of the third solar cell and the electron terminals or hole terminals of the fourth solar cell are connected to the fourth connector, wherein a column direction length of the third connector is larger than a column direction length of the fourth connector, and a line direction width of the third connector is less than a line direction width of the fourth connector, and wherein the third connector directly connects the hole terminals or electron terminals of the first solar cell and the electron terminals or hole terminals of the second solar cell.

2. The solar cell module of claim 1, wherein the fourth connector is positioned on different sides of the third and fourth solar cells.

3. The solar cell module of claim 1, further comprising a back sheet positioned under the second protective layer, and wherein the third connector is formed on the back sheet in a pattern shape.

4. The solar cell module of claim 3, wherein the second protective layer includes openings exposing the hole terminals and the electron terminals of the each solar cell.

5. The solar cell module of claim 1, wherein a distance between the hole terminals and an edge side in each of the first and second solar cells is different from a distance between the electron terminals and the edge side in each of the first and second solar cells.

6. The solar cell module of claim 5, wherein a distance between the hole terminals and the edge side in the first and second solar cells is less than a distance between the electron terminals and the edge side in the first and second solar cells, and a distance between the electron terminals and another edge side in the first and second solar cells is less than a distance between the hole terminals and the another edge side of the first and second solar cells.

7. The solar cell module of claim 5, wherein a terminal disposed in the third solar cell is the same kind as a terminal disposed in the fourth solar cell.

8. The solar cell module of claim 5, wherein the third connector is positioned to overlap the first and second solar cells.

9. The solar cell module of claim 5, wherein a distance between the hole terminals or electron terminals connected to the fourth connector and an edge side in the third solar cell is less than a distance between the electron terminals or hole terminals not connected to the fourth connector and the edge side in the third solar cell, and a distance between the electron terminals or hole terminals connected to the fourth connector and another edge side in the third solar cell is less than a distance between the hole terminals or electron terminals not connected to the fourth connector and the another edge side in the third solar cell.

10. The solar cell module of claim 5, wherein the fourth connector is positioned to overlap the third and fourth solar cells.

* * * * *